(12) United States Patent
Masuda et al.

(10) Patent No.: US 8,558,614 B2
(45) Date of Patent: Oct. 15, 2013

(54) AMPLIFICATION DEVICE

(75) Inventors: Keiji Masuda, Sendai (JP); Yoshihiro Nozue, Kawasaki (JP); Masayuki Onuki, Sendai (JP)

(73) Assignee: Fujitsu Limited, Kawasaki (JP)

( * ) Notice: Subject to any disclaimer, the term of this patent is extended or adjusted under 35 U.S.C. 154(b) by 91 days.

(21) Appl. No.: 13/420,897

(22) Filed: Mar. 15, 2012

(65) Prior Publication Data

US 2012/0235738 A1    Sep. 20, 2012

(30) Foreign Application Priority Data

Mar. 18, 2011    (JP) .................................. 2011-060976

(51) Int. Cl.
*H03G 3/20*    (2006.01)
(52) U.S. Cl.
USPC .............................. 330/136; 330/59; 330/297
(58) Field of Classification Search
USPC ............................................ 330/136, 59, 297
See application file for complete search history.

(56) References Cited

U.S. PATENT DOCUMENTS

| | | | |
|---|---|---|---|
| 5,004,972 A * | 4/1991 | Roth | 323/320 |
| 7,795,965 B2 * | 9/2010 | Suzuki et al. | 330/59 |
| 7,990,074 B2 * | 8/2011 | Sandner et al. | 315/291 |
| 8,089,323 B2 * | 1/2012 | Tarng et al. | 331/117 FE |
| 2005/0120870 A1 * | 6/2005 | Ludwig | 84/661 |
| 2012/0256688 A1 * | 10/2012 | Onishi | 330/149 |

FOREIGN PATENT DOCUMENTS

| | | |
|---|---|---|
| JP | 2006-286746 | 10/2006 |
| JP | 2008-47767 | 2/2008 |
| JP | 2008-198731 | 8/2008 |
| JP | 2010-73744 | 4/2010 |

\* cited by examiner

*Primary Examiner* — Patricia Nguyen
(74) *Attorney, Agent, or Firm* — Staas & Halsey LLP

(57) ABSTRACT

An amplification device that amplifies a signal, the amplification device includes an amplification unit that amplifies the signal using supplied power, a variable power supply unit that changes the power supplied to the amplification unit in accordance with an envelope of the signal, a radiation unit that radiates light onto the amplification unit, and a control unit that controls the light to be emitted from the radiation unit in accordance with slope of the envelope of the signal.

8 Claims, 21 Drawing Sheets

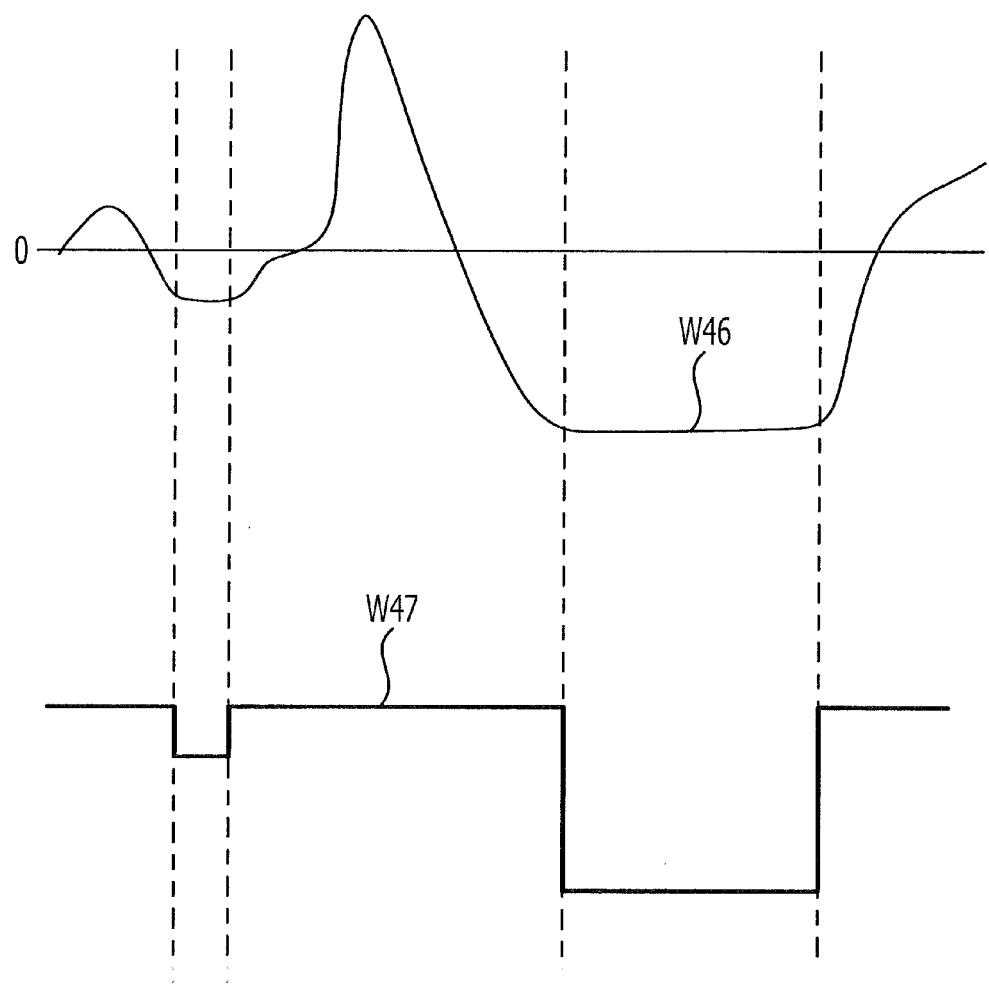

W51

W52

W53

INTENSITY

W55

POWER CONSUMPTION
(AREA OF HATCHED PORTIONS)

Idq     0%

50%     50%

0%

W54     MAXIMUM POWER

AMPLIFICATION DEVICE

CROSS-REFERENCE TO RELATED APPLICATION

This application is based upon and claims the benefit of priority of the prior Japanese Patent Application No. 2011-60976, filed on Mar. 18, 2011, the entire contents of which are incorporated herein by reference.

FIELD

The embodiments discussed herein are related to an envelope-tracking amplification device.

BACKGROUND

Nowadays, in consideration of international environmental policies, reduction of the power consumption of electronic devices is desired. For example, a high-frequency amplification device for amplifying transmission signals is present in the final stage of a transmission section of a base station for a mobile telephone system, and reduction of the power consumption of the high-frequency amplification device is desired.

In general, a high-frequency amplification device has low power efficiency. An envelope-tracking amplification device is an amplification device for improving power efficiency. The envelope-tracking amplification device supplies an amplifier with power supply voltage corresponding to the amplitude of an envelope of a signal to be amplified by the amplifier, thereby reducing power loss.

As an example, when the amplitude of an envelope of a signal to be amplified is less than or equal to a certain threshold value the envelope-tracking amplification device supplies the amplifier with only fixed-voltage power generated by a high-efficiency power supply. When the amplitude of an envelope of a signal to be amplified exceeds the certain threshold value, the envelope-tracking amplification device supplies the amplifier with, in addition to the fixed-voltage power, variable-voltage power that responds to (tracks) the envelope of the signal to be amplified and uses a low-efficiency power supply. Thus, by changing the power supply based on the value of an envelope of a signal to be amplified, the envelope-tracking amplification device improves the power efficiency of the amplification.

In an amplifier of the envelope-tracking amplification device, for example, a laterally diffused metal oxide semiconductor (LD-MOS) composed of silicon, a field-effect transistor (FET) using gallium arsenide (GaAs) or gallium nitride (GaN) as a material thereof, a high electron mobility transistor (HEMT), or the like is used. In particular, a GaN-FET is superior to other devices in terms of saturation performance, high-frequency gain, and power efficiency, and therefore is increasingly being used in amplifiers in recent years.

However, a GaN-FET has a characteristic called "current collapse" where drain current decreases. For example, when a GaN-FET's drain voltage is high and gate voltage is low, electrons are trapped around the GaN-FET's gate. When electrons are trapped, the electron density in the GaN-FET decreases and the channel resistance increases. Therefore, the drain current of the GaN-FET decreases. For an amplifier using a GaN-FET, the current collapse decreases the degree of amplification and increases distortion of the signal.

In order to release trapped electrons, energy for causing the electrons to pass through a barrier may be supplied to the electrons. For example, the GaN-FET and a light-emitting device are optically coupled with each other and energy is supplied to the trapped electrons by radiating light onto the GaN-FET from the coupled light-emitting device. Thus, an increase in the on-resistance (that is, a decrease in current) due to the current collapse may be addressed.

A group-III nitride semiconductor FET and a group-III nitride semiconductor field-effect semiconductor device, in which a light source for radiating light onto the FET and a driving circuit for the light source are reduced in size, have been proposed (for example, refer to Japanese Laid-open Patent Publication No. 2008-47767).

In addition, a semiconductor device capable of reducing the effects of current collapse in an FET with high effectiveness has also been proposed (for example, refer to Japanese Laid-open Patent Publication No. 2008-198731).

However, regardless of the energy for addressing the current collapse, one problem is that power is wastefully consumed when light is radiated in accordance with the on or off state of an amplifier.

For example, when light with intensity higher than an intensity desired to release trapped electrons is radiated while the amplifier is turned on, power is wastefully consumed.

SUMMARY

According to an aspect of the invention, an amplification device that amplifies a signal, the amplification device includes an amplification unit that amplifies the signal using supplied power, a variable power supply unit that changes the power supplied to the amplification unit in accordance with an envelope of the signal, a radiation unit that radiates light onto the amplification unit, and a control unit that controls the light to be emitted from the radiation unit in accordance with slope of the envelope of the signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a diagram illustrating the operation of a light radiation driving circuit.

DESCRIPTION OF EMBODIMENTS

Embodiments will be described in detail hereinafter with reference to the drawings.

First Embodiment

Figure 1:
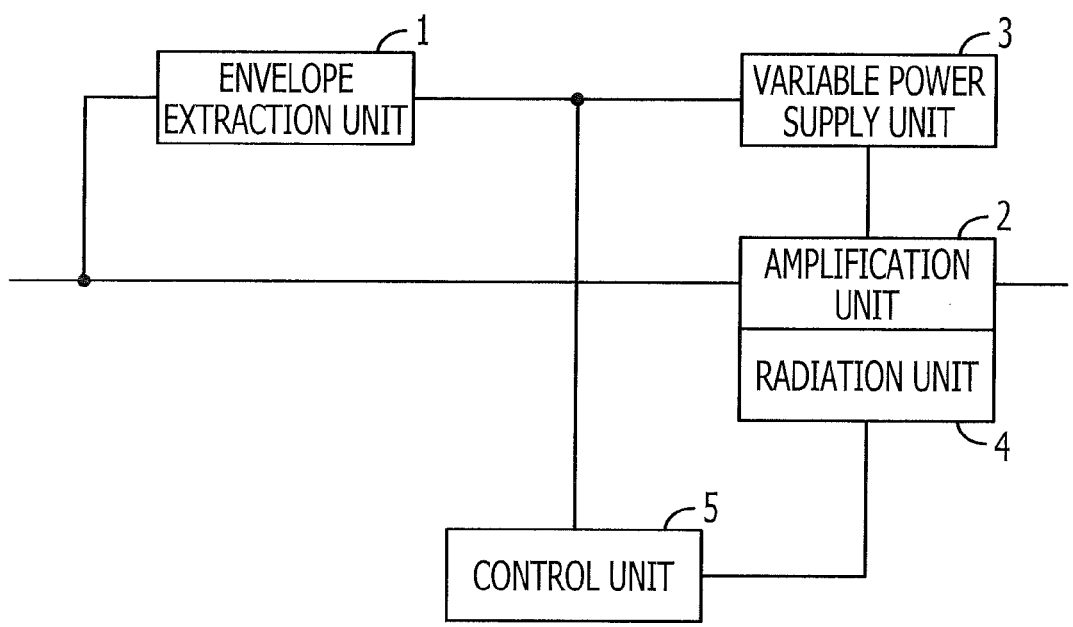
FIG. 1 is a diagram illustrating an example of an amplification device according to a first embodiment.

FIG. 1 is a diagram illustrating an example of an amplification device according to a first embodiment. As illustrating in FIG. 1, the amplification device has an envelope extraction unit 1, an amplification unit 2, a variable power supply unit 3, a radiation unit 4, and a control unit 5.

The envelope extraction unit 1 receives a signal to be amplified by the amplification unit 2. The signal to be amplified by the amplification unit 2 is, for example, a signal that has been subjected to frequency conversion (modulation) in such a way as to have a radio frequency (that is, a radio signal). The envelope extraction unit 1 extracts an envelope of the signal to be amplified by the amplification unit 2.

The amplification unit 2 amplifies an input signal using power supplied from the variable power supply unit 3.

The variable power supply unit 3 changes the power supplied to the amplification unit 2 in accordance with the envelope output from the envelope extraction unit 1.

The radiation unit 4 may radiate light onto the amplification unit 2.

The control unit 5 controls the light that may be emitted from the radiation unit 4 in accordance with the slope of the envelope output from the envelope extraction unit 1.

The degree of recovery from current collapse realized by the radiation of light onto the amplification unit 2 varies depending on the degree of attenuation of the energy of the signal to be amplified by the amplification unit 2 (hereinafter referred to as the "signal energy"). The degree of attenuation of the signal energy may be identified from the slope of the envelope of the signal to be amplified. Therefore, the control unit 5 controls the light in accordance with the slope of the envelope while, for example, regarding the degree of the slope of the envelope of the signal as a degree for realizing recovery from current collapse.

For example, if the amplitude of an envelope sharply changes from relatively large to relatively small, a change in the gain of the amplification unit 2 caused by current collapse is large, thereby significantly distorting the signal to be amplified. In this case, the control unit 5 controls the radiation unit 4 in such a way as to emit light of relatively high intensity, in order to cause the amplification unit 2 to quickly recover from the current collapse.

On the other hand, if the amplitude of an envelope gradually changes from relatively large to relatively small, the amplitude of the envelope remains relatively large for a longer time than if the amplitude sharply changes from relatively large to relatively small, and therefore the thermal energy generated by the amplification unit 2 is correspondingly larger. For this reason, a change in the gain of the amplification unit 2 caused by current collapse is smaller and accordingly distortion of the signal to be amplified is smaller. In this case, the amplification unit 2 may recover from the current collapse with light whose intensity is lower than the above-described light of relatively high intensity, and therefore, the control unit 5 controls the radiation unit 4 in such a way as to emit light of relatively low intensity.

Whether the amplitude of an envelope changes sharply or gradually may be judged from the slope of the envelope. That is, by controlling the light that may be emitted from the radiation unit 4 in accordance with the slope of an envelope, the control unit 5 may, for example, appropriately address current collapse without distorting the signal to be amplified, and reduce the power consumption desired to radiate light.

As described above, the control unit 5 controls the light that may be emitted from the radiation unit 4 in accordance with the slope of an envelope of a signal to be amplified by the amplification unit 2. Therefore, the amplification device may appropriately address current collapse while reducing the power consumption in the radiation of light.

Second Embodiment

Next, a second embodiment will be described in detail hereinafter with reference to the drawings.

Figure 2:
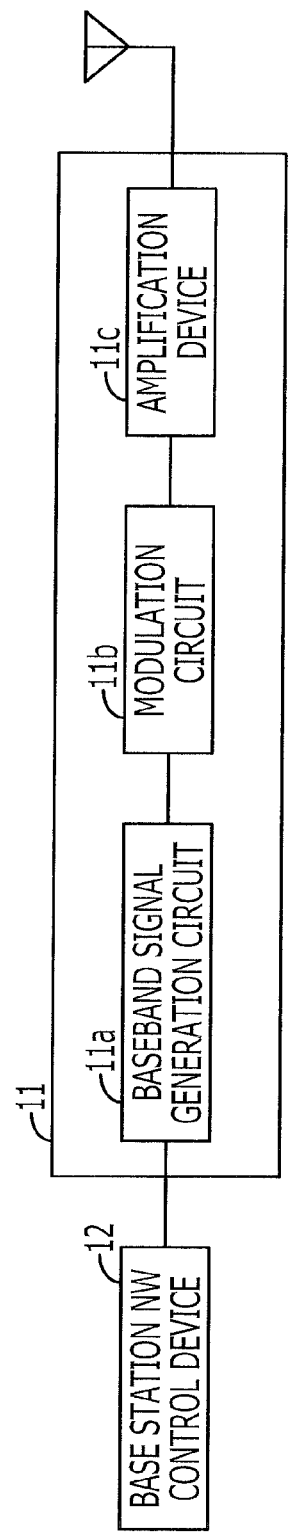
FIG. 2 is a diagram illustrating an example of the application of an amplification device according to a second embodiment.

FIG. 2 is a diagram illustrating an example of the application of an amplification device according to the second embodiment. FIG. 2 illustrates an example in which the amplification device is applied in a base station for a mobile telephone system. As illustrated in FIG. 2, a base station 11 includes a baseband signal generation circuit 11a, a modulation circuit 11b, and an amplification device 11c. FIG. 2 also illustrates a base station network control device 12 that controls the base station 11.

The baseband signal generation circuit 11a generates a baseband signal from a signal transmitted from the base station network control device 12. The baseband signal generation circuit 11a may be realized by a digital signal processor (DSP), a central processing unit (CPU), a digital-to-analog conversion circuit, or the like.

The modulation circuit 11b modulates the baseband signal generated by the baseband signal generation circuit 11a to a radio signal. For example, the modulation circuit 11b performs frequency conversion on the baseband signal such that the baseband signal has a radio frequency.

The amplification device 11c amplifies the radio signal output from the modulation circuit 11b. The amplified radio signal is, for example, wirelessly transmitted to a mobile telephone through an antenna.

The modulation circuit 11b and the amplification device 11c may be realized by analog circuits.

Figure 3:
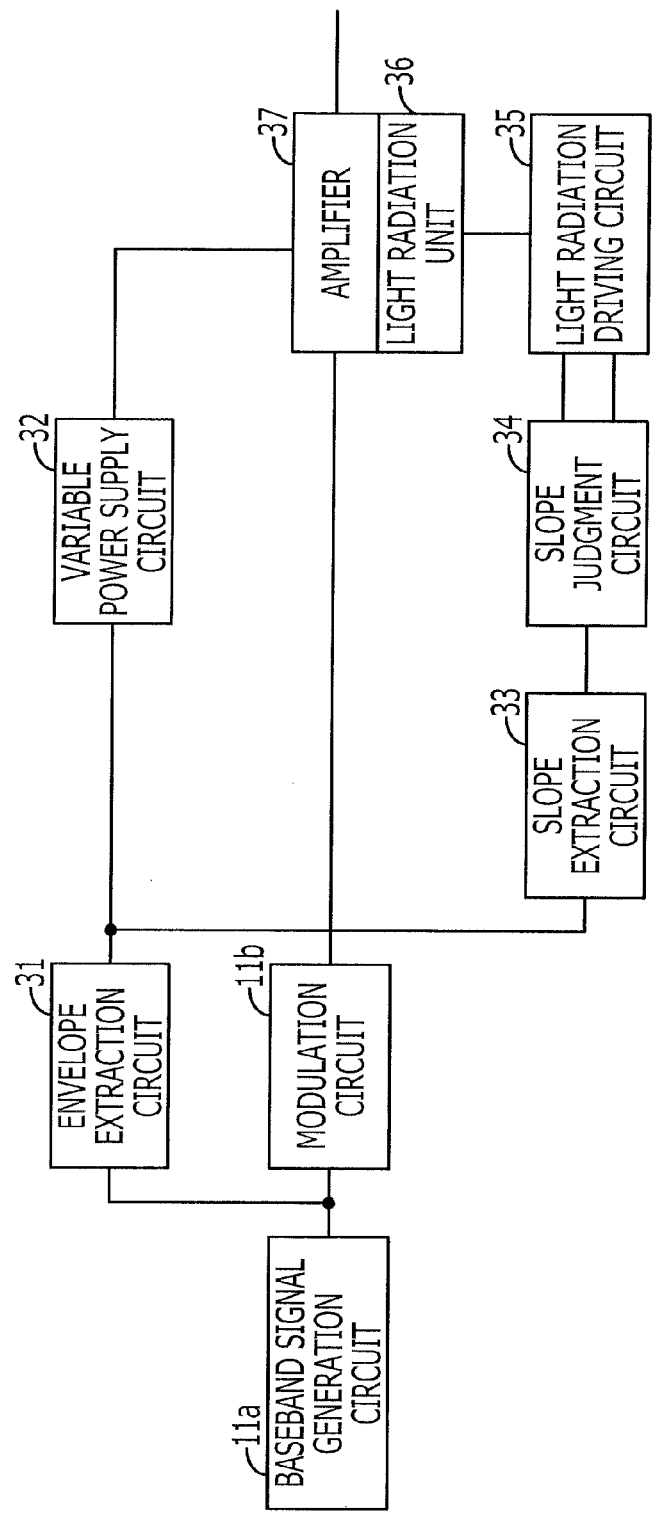
FIG. 3 is a diagram illustrating an example of a circuit block of the amplification device according to the second embodiment.

FIG. 3 is a diagram illustrating an example of a circuit block of the amplification device 11c. As illustrated in FIG. 3, the amplification device 11c has an envelope extraction circuit 31, a variable power supply circuit 32, a slope extraction circuit 33, an slope judgment circuit 34, a light radiation driving circuit 35, a light radiation unit 36, and an amplifier 37. FIG. 3 also illustrates the baseband signal generation circuit 11a and the modulation circuit 11b illustrated in FIG. 2. The envelope extraction circuit 31 illustrated in FIG. 3 corresponds, for example, to the envelope extraction unit 1 illustrated in FIG. 1. The amplifier 37 corresponds, for example, to the amplification unit 2 illustrated in FIG. 1. The variable power supply circuit 32 corresponds, for example, to the variable power supply unit 3 illustrated in FIG. 1. The light radiation unit 36 corresponds, for example, to the radiation unit 4 illustrated in FIG. 1. The slope extraction circuit 33 and the slope judgment circuit 34, and the light radiation driving circuit 35 correspond, for example, to the control unit 5 illustrated in FIG. 1.

The envelope extraction circuit 31 extracts an envelope of a radio signal to be amplified by the amplifier 37. Here, the radio signal input to the amplifier 37 is a baseband signal that has been modulated so as to have a radio frequency. Therefore, the baseband signal output from the baseband signal generation circuit 11a may be regarded as the envelope of the radio signal to be amplified by the amplifier 37. That is, the envelope extraction circuit 31 does not generate or process an envelope of a radio signal, but extracts an envelope that already exists (that is, outputs the baseband signal to the variable power supply circuit 32). The envelope extraction circuit 31 may receive a radio signal output from the modulation circuit 11b, instead. In this case, the envelope extraction circuit 31 extracts an envelope from the radio signal.

The variable power supply circuit 32 changes power supplied to the amplifier 37 in accordance with the envelope output from the envelope extraction circuit 31. For example, when the amplitude of the envelope is less than or equal to a certain threshold value, the variable power supply circuit 32 supplies only fixed-voltage power generated by a high-efficiency power supply to the amplifier 37. When the amplitude of the envelope exceeds the certain threshold value, the variable power supply circuit 32 supplies, in addition to the fixed-voltage power, variable-voltage power corresponding to the envelope of the signal to be amplified to the amplifier 37 using a low-efficiency power supply.

The slope extraction circuit 33 extracts the slope of the envelope output from the envelope extraction circuit 31.

The slope judgment circuit 34 detects and holds a minimum value of the slope output from the slope extraction circuit 33. The slope judgment circuit 34 also detects a zero slope output from the slope extraction circuit 33.

Figure 4:
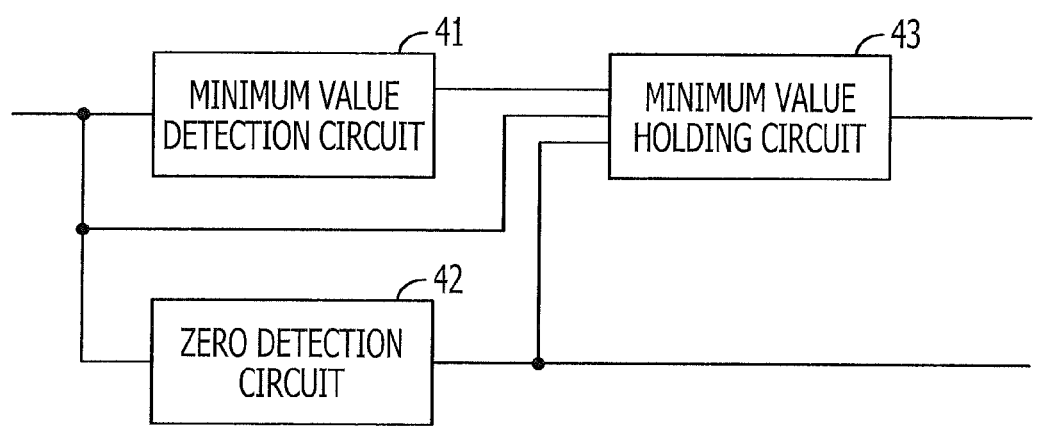
FIG. 4 is a diagram illustrating an example of a block of a slope judgment circuit.

FIG. 4 is a diagram illustrating an example circuit block diagram of the slope judgment circuit 34. As illustrated in FIG. 4, the slope judgment circuit 34 has a minimum value detection circuit 41, a zero detection circuit 42, and a minimum value holding circuit 43.

The minimum value detection circuit 41 is input with the slope of the envelope extracted by the slope extraction circuit 33. The minimum value detection circuit 41 detects a minimum value of the slope of the extracted envelope.

The zero detection circuit 42 is input with the slope of the envelope extracted by the slope extraction circuit 33. The zero detection circuit 42 detects a change in the slope of the extracted envelope from negative to positive. That is, the zero detection circuit 42 detects a zero slope when the slope of the extracted envelope changes from negative to positive.

The minimum value holding circuit 43 is input with the slope of the envelope extracted by the slope extraction circuit 33. The minimum value holding circuit 43 is also input with results of the detection of a minimum value performed by the minimum value detection circuit 41 and results of the detection of zeros performed by the zero detection circuit 42. The minimum value holding circuit 43 outputs the slope of the input envelope and holds the minimum value of the slope of the input envelope in accordance with the results of the detection of the minimum value performed by the minimum value detection circuit 41 and the results of the detection of zeros performed by the zero detection circuit 42.

For example, the minimum value holding circuit 43 outputs the slope of the input envelope. When a minimum value of the slope of the envelope has been detected by the minimum value detection circuit 41, the minimum value holding circuit 43 holds the minimum value of the slope. Thereafter, when a zero slope of the envelope is detected by the zero detection circuit 42, the minimum value holding circuit 43 outputs the slope of the input envelope.

We refer to FIG. 3 again. The light radiation driving circuit 35 controls the light that may be emitted from the light radiation unit 36 in accordance with signals output from the zero detection circuit 42 and the minimum value holding circuit 43 in the slope judgment circuit 34.

For example, the light radiation driving circuit 35 outputs, to the light radiation unit 36, a driving current corresponding to the magnitude (absolute value) of the minimum value of the slope of the envelope held by the minimum value holding circuit 43. In addition, when a signal indicating that the magnitude is zero (that is, zero slope) has been output from the minimum value holding circuit 43, the light radiation driving circuit 35 stops outputting the driving current.

The light radiation unit 36 radiates light onto the amplifier 37 in accordance with the driving current output from the light radiation driving circuit 35. The light radiation unit 36 is, for example, a light-emitting diode (LED).

The amplifier 37 amplifies the radio signal output from the modulation circuit 11b. The amplifier 37 is, for example, a GaN-FET. The amplifier 37, which may be a GaN-FET, and the light radiation unit 36 are, for example, formed as a unit. Current collapse in the amplifier 37 may be addressed by the light radiated from the light radiation unit 36.

The operations of the slope extraction circuit 33, the minimum value detection circuit 41, the zero detection circuit 42, the minimum value holding circuit 43, and the light radiation driving circuit 35 will be described hereinafter.

Figure 5:
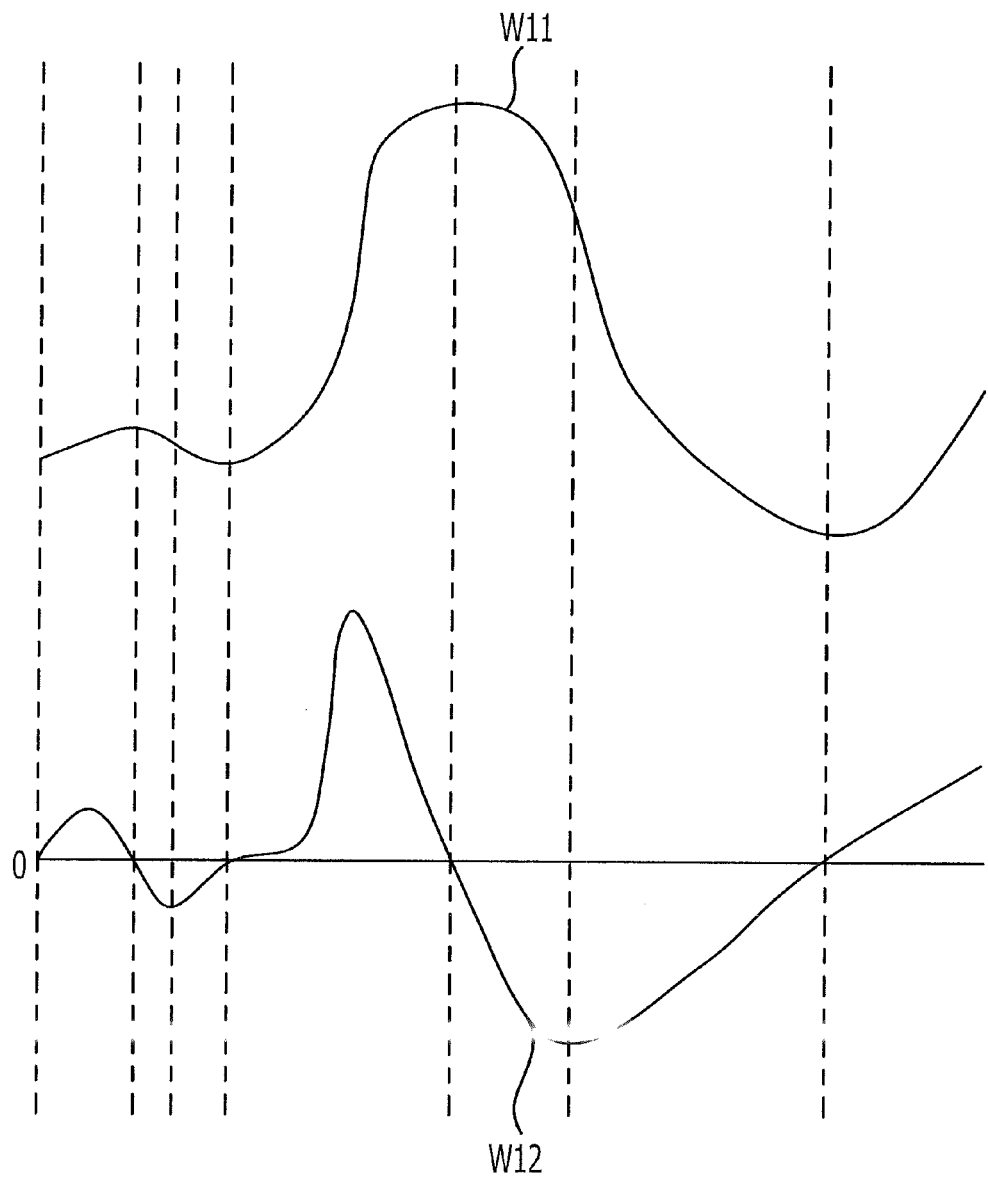
FIG. 5 is a diagram illustrating the operation of a slope extraction circuit.

FIG. 5 is a diagram illustrating the operation of the slope extraction circuit 33. A waveform W11 illustrated in FIG. 5 indicates a signal input to the slope extraction circuit 33. That is, the waveform W11 indicates an envelope (the waveform of a baseband signal) of a radio signal to be amplified by the amplifier 37.

A waveform W12 indicates a signal output from the slope extraction circuit 33. That is, the waveform W12 indicates the slope of the envelope of the radio signal to be amplified by the amplifier 37.

Dash-dot lines illustrated in FIG. 5 indicate points at which the slope of the waveform W11 is zero. When the slope of the waveform W11 is zero, the value of the waveform W12 is also zero.

In addition, dash-dot-dot lines illustrated in FIG. 5 indicate inflection points of the waveform W11 and maximum or minimum values of the waveform W12. In FIG. 5, dash-dot-dot lines are used to indicate only some of the inflection points (not all the inflection points are indicated by the dash-dot-dot lines).

Figure 6:
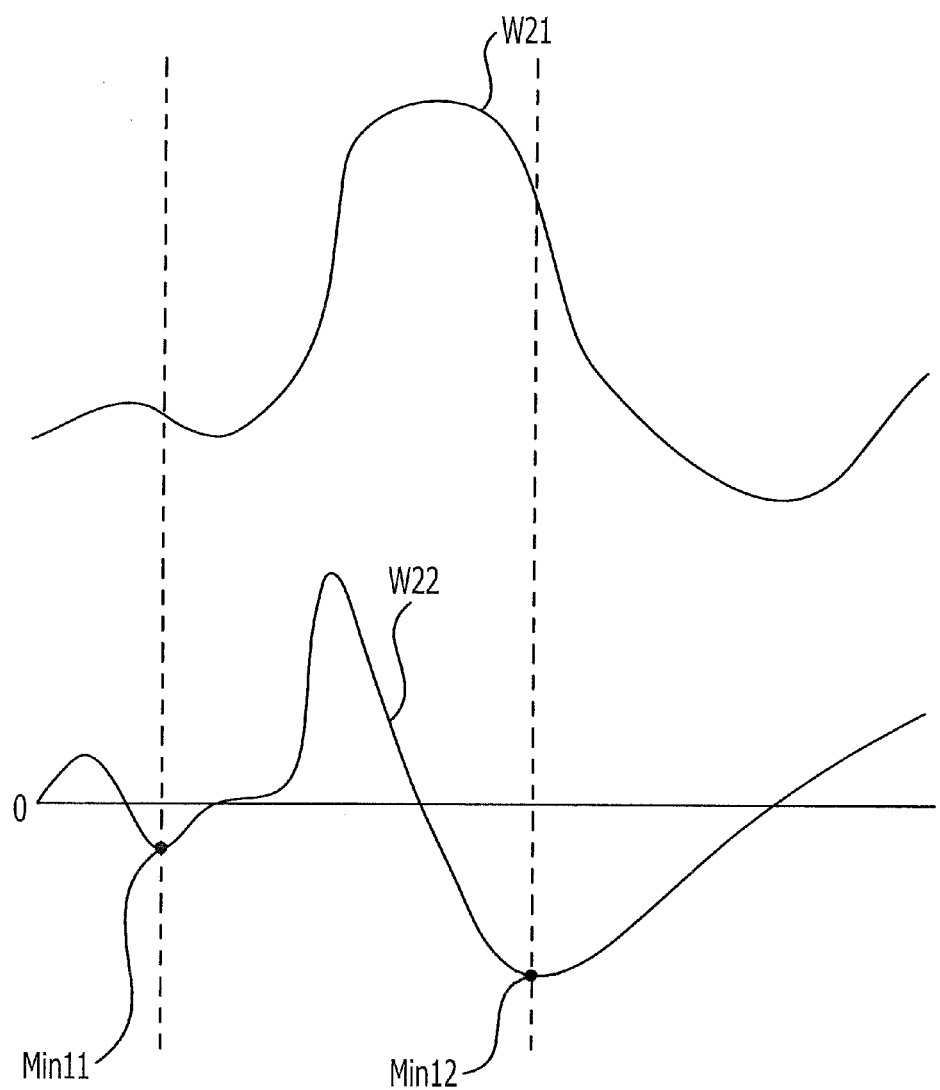
FIG. 6 is a diagram illustrating the operation of a minimum value detection circuit.

FIG. 6 is a diagram illustrating the operation of the minimum value detection circuit 41. A waveform W21 illustrated in FIG. 6 indicates an envelope of a radio signal output from the envelope extraction circuit 31. A waveform W22 indicates the slope of an envelope of a radio signal output from the slope extraction circuit 33. That is, the waveform W22 indicates the slope of the waveform W21. The slope of the envelope, which is indicated by the waveform W22, is input to the minimum value detection circuit 41.

The minimum value detection circuit 41 detects minimum values of downwardly convex curves (portions of the curves where the slope thereof is negative) of the input waveform W22. That is, the minimum value detection circuit 41 detects the lowest values of the downward slope of the envelope. For example, the minimum value detection circuit 41 detects minimum values Min11 and Min12 as illustrated in FIG. 6.

Figure 7:
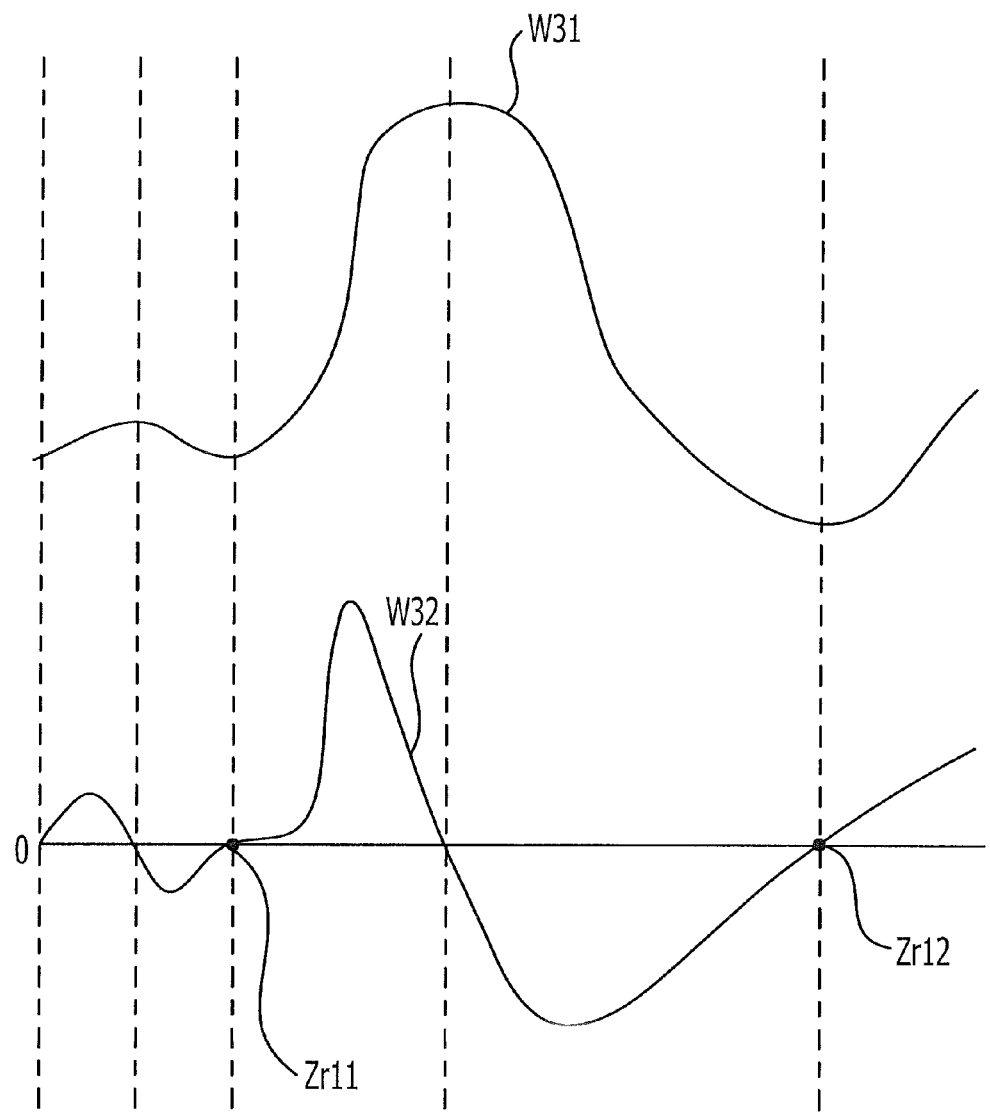
FIG. 7 is a diagram illustrating the operation of a zero detection circuit.

FIG. 7 is a diagram illustrating the operation of the zero detection circuit 42. A waveform W31 illustrated in FIG. 7 indicates the envelope of the radio signal output from the envelope extraction circuit 31. A waveform W32 indicates the slope of the envelope of the radio signal output from the slope extraction circuit 33. That is, the waveform W32 indicates the slope of the waveform W31. The slope of the envelope indicated by the waveform W32 is input to the zero detection circuit 42.

The zero detection circuit 42 detects zero slope at a time when the slope of the envelope indicated by the waveform W32 changes from negative to positive. For example, the zero detection circuit 42 detects zeros Zr11 and Zr12 illustrated in FIG. 7.

Figure 8:
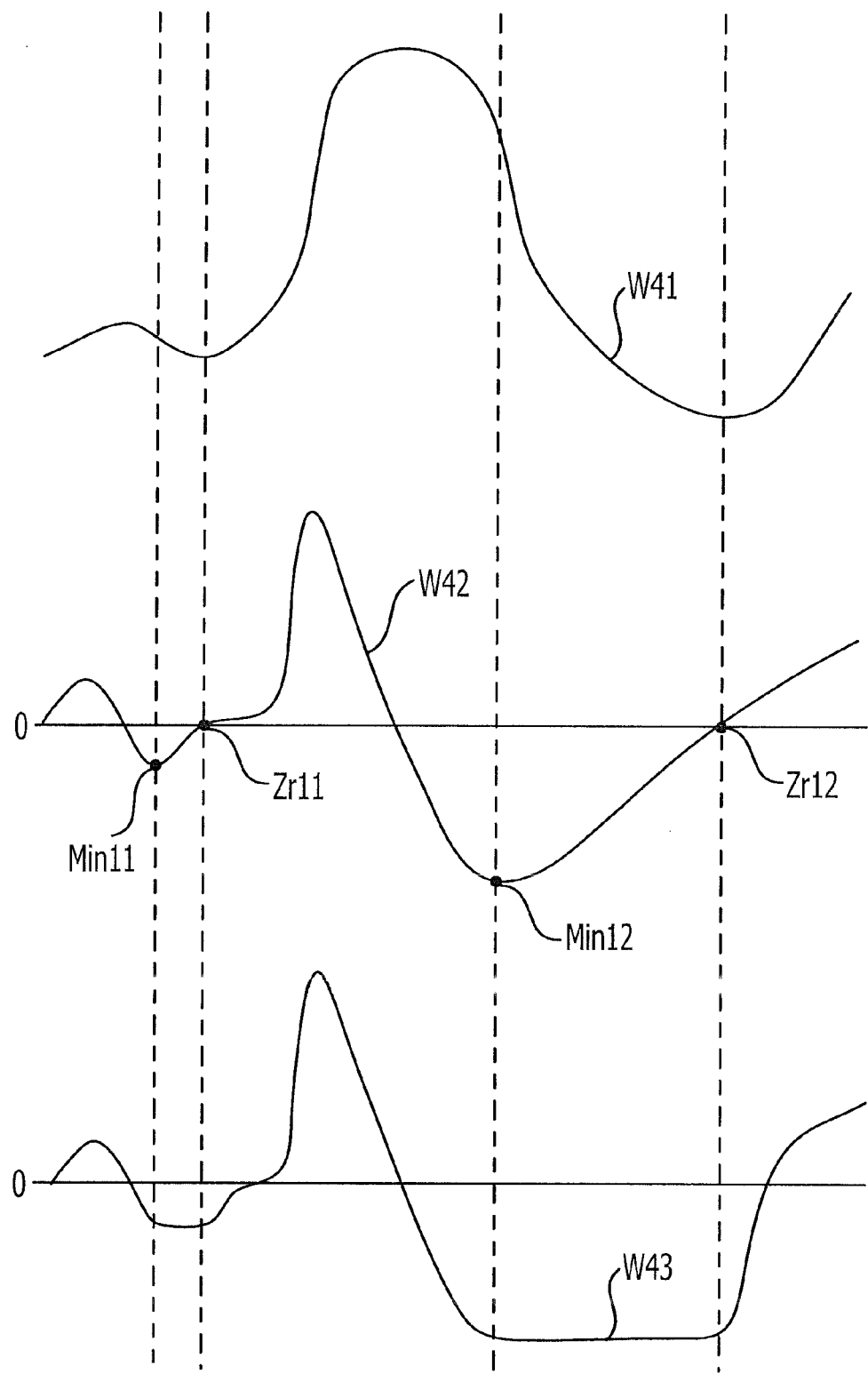
FIG. 8 is a diagram illustrating the operation of a minimum value holding circuit.

FIG. 8 is a diagram illustrating the operation of the minimum value holding circuit 43. A waveform W41 illustrated in FIG. 8 indicates the envelope of the radio signal output from the envelope extraction circuit 31. A waveform W42 indicates the slope of the envelope of the radio signal output from the slope extraction circuit 33. That is, the waveform W42 indicates the slope of the waveform W41. A waveform W43 indicates a signal output from the minimum value holding circuit 43. In the waveform W42, the minimum values Min11 and Min12 detected by the minimum value detection circuit 41 and the zeroes Zr11 and Zr12 detected by the zero detection circuit 42 are illustrated.

The minimum value holding circuit 43 is input with the slope (the waveform W42 illustrated in FIG. 8) of the envelope extracted by the slope extraction circuit 33, the results of the detection of minimum values performed by the minimum value detection circuit 41, and the results of the detection of zeros performed by the zero detection circuit 42. The minimum value holding circuit 43 outputs the slope of the input envelope, but if a minimum value of the slope of the envelope has been detected by the minimum value detection circuit 41, the minimum value holding circuit 43 holds and outputs the slope (that is, the slope at the minimum value) that is being input at that time. Thereafter, when zero slope of the envelope has been detected by the zero detection circuit 42, the minimum value holding circuit 43 again outputs the slope of the envelope that is being input until a minimum value of the slope is again detected.

For example, as illustrated by the waveform W43, when the minimum values Min11 and Min12 have been detected by the minimum value detection circuit 41, the minimum value holding circuit 43 holds and outputs the slope. That is, the minimum value holding circuit 43 holds and outputs minimum values corresponding to negative portions of the slope of the envelope. When the zeroes Zr11 and Zr12 of the slope of the envelope have been detected by the zero detection circuit 42 after the minimum value holding circuit 43 have hold the minimum values, the minimum value holding circuit 43 outputs the slope of the envelope that is being input.

FIG. 9 is a diagram illustrating the operation of the light radiation driving circuit 35. A waveform W46 illustrated in FIG. 9 indicates a signal output from the minimum value holding circuit 43. A waveform W47 indicates driving current output from the light radiation driving circuit 35 to the light radiation unit 36.

The light radiation driving circuit 35 is input with the signal output from the minimum value holding circuit 43 and a signal output from the zero detection circuit 42. The light radiation driving circuit 35 outputs, to the light radiation unit 36, driving current corresponding to the magnitude of the slope held by the minimum value holding circuit 43. For example, as illustrated by the waveform W47, the light radiation driving circuit 35 outputs a rectangular wave signal having depths corresponding to the magnitude of the minimum values held by the minimum value holding circuit 43 (that is, outputs the driving current). The light radiation driving circuit 35 continues to output the rectangular wave signal having depths corresponding to the magnitude of the held minimum values until a signal of zero slope is output from the zero detection circuit 42. When a signal of zero slope is output from the zero detection circuit 42, the light radiation driving circuit 35 stops outputting the driving current.

The operation of the amplification device 11c will be described hereinafter.

Figure 10A:
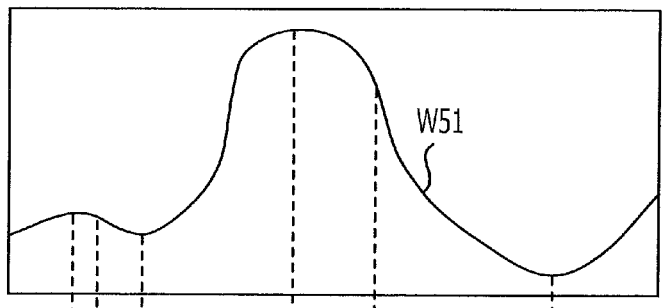
FIGS. 10A to 10C are first diagrams illustrating the operation of the amplification device according to the second embodiment.
Figure 10B:
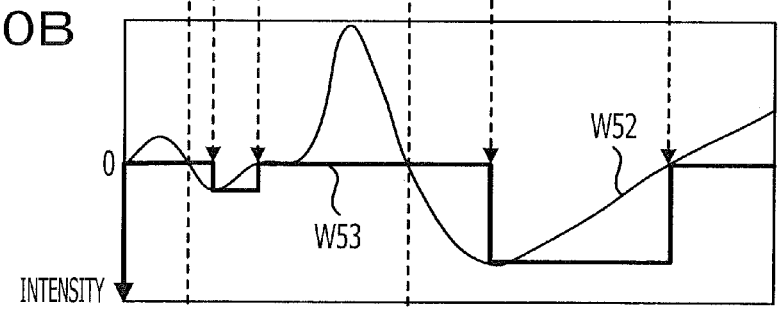
Figure 10C:
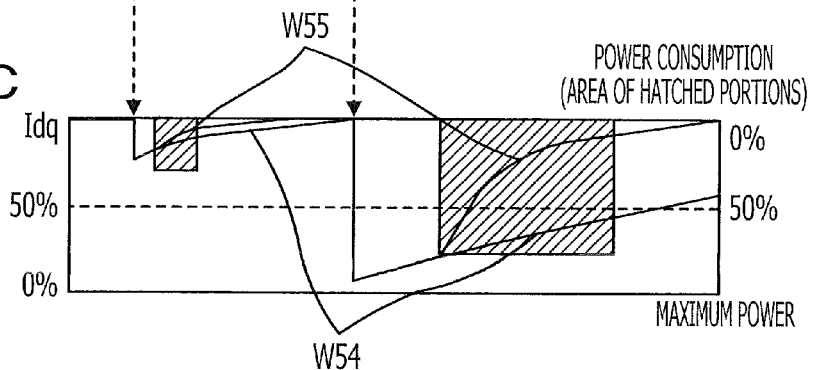

FIGS. 10A to 10C are first diagrams illustrating the operation of the amplification device 11c. A waveform W51 illustrated in FIG. 10A indicates an envelope output from the envelope extraction circuit 31. That is, the waveform W51 indicates the envelope of a radio signal to be amplified by the amplifier 37.

A waveform W52 illustrated in FIG. 10B indicates the slope of the waveform W51. That is, the waveform W52 indicates the slope of the envelope output from the envelope extraction circuit 31.

A waveform W53 illustrated in FIG. 10B indicates the driving current output from the light radiation driving circuit 35. As illustrated by the waveform W53, the light radiation driving circuit 35 outputs driving current with magnitude corresponding to negative peaks of the waveform W52. The light radiation driving circuit 35 then continues to output the driving current corresponding to the magnitude of the negative peaks until the waveform W52 becomes zero. When the waveform W52 has become zero, the light radiation driving circuit 35 stops outputting the driving current.

A signal having the waveform W53 is output to the light radiation unit 36. The light radiation unit 36 emits light corresponding to the driving current to the amplifier 37. Therefore, the downward direction of the waveform W53 corresponds to the intensity of the light emitted from the light radiation unit 36. In addition, negative periods of the waveform W53 correspond to periods in which the light is radiated from the light radiation unit 36.

A waveform W54 illustrated in FIG. 10C indicates a change in drain current (Idq) caused by current collapse at a time when light is not radiated onto the amplifier 37.

A waveform W55 illustrated in FIG. 10C indicates a change in drain current caused by current collapse at a time when the light radiation unit 36 is driven by the driving current having the waveform W53 and light is radiated onto the amplifier 37. As illustrated by the waveforms W54 and W55, the drain current of the amplifier 37 suddenly drops because of current collapse. When light is not radiated onto the amplifier 37, the drain current gradually recovers as illustrated by the waveform W54. However, when light is radiated onto the amplifier 37, the drain current recovers earlier than when light is not radiated, as illustrated by the waveform W55.

If the radiation of light begins at the negative peaks of the slope (the waveform W52) of the envelope, there is a period in which light is not radiated onto the amplifier 37, namely from a decrease in the drain current due to the current collapse to the beginning the radiation of light. In the period in which light is not radiated, however, current caused by the radio signal flows through the drain, and therefore current recovery is expected to be realized by self-heating. That is, effects of a decrease in the drain current caused by the current collapse are limited in the period in which light is not radiated.

Hatched portions in FIG. 10C indicate power consumed by the light radiation unit 36. For example, the hatched portions indicate power used to operate a LED. If light is radiated while the amplifier 37 is being operated, that is if light is radiated in the entire interval of the waveform W53, the power consumed by the light radiation unit 36 corresponds to the sum of portions that are not hatched and the hatched portions in FIG. 10C. On the other hand, if light is radiated in accordance with the slope of the envelope, the power consumed by the light radiation unit 36 corresponds to the hatched portions in FIG. 10C. Therefore, the amplification device 11c illustrated in FIG. 3 may reduce power consumption.

Figure 11A:
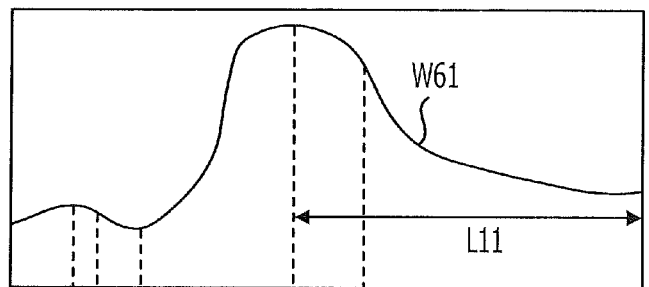
FIGS. 11A to 11C are second diagrams illustrating the operation of the amplification device according to the second embodiment.
Figure 11B:
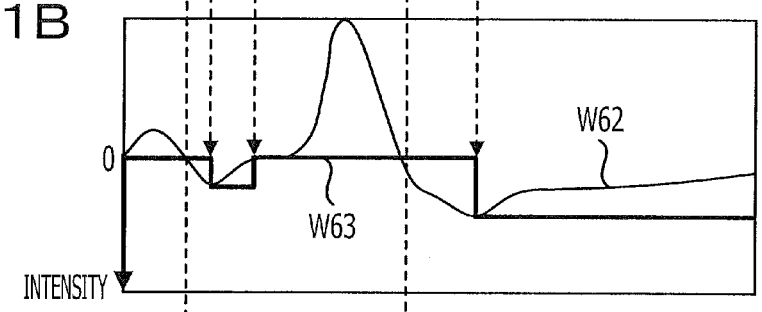
Figure 11C:
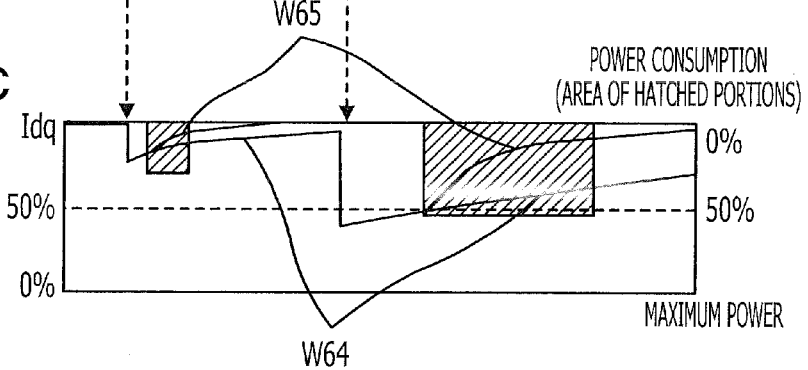

FIGS. 11A to 11C are second diagrams illustrating the operation of the amplification device 11c. Waveforms W61 to W65 illustrated in FIGS. 11A to 11C are almost the same as the waveforms W51 to W55, respectively, which are illustrated in FIGS. 10A to 10C. Differences between the waveforms W61 to W65 and the waveforms W51 to W55 will be described hereinafter.

The way an envelope inclines downward from the peak in the waveform W61 illustrated in FIG. 11A is different from that in the waveform W51 illustrated in FIG. 10A. For example, as illustrated by a period L11 illustrated in FIG. 11A, the waveform W61 gradually inclines downward compared to the waveform W51.

Since the waveform W61 gradually inclines downward compared to the waveform W51, a negative peak of the slope of waveform W61 is smaller than that of the waveform W51. For example, the absolute value of a negative peak in the right half of the waveform W62 illustrated in FIG. 11B is smaller than that in the right half of the waveform W52 illustrated in FIG. 10B. Therefore, a downward convex in the right half of the waveform W63 illustrated in FIG. 11B is shallower than a downward convex in the right half of the waveform W53 illustrated in FIG. 10B.

The light radiation driving circuit 35 outputs driving current having the waveform W63. Therefore, in the example illustrated in FIGS. 11A to 11C, the light radiation driving circuit 35 outputs driving current whose absolute value is smaller than in the example illustrated in FIGS. 10A to 10C, and accordingly the light radiation unit 36 radiates light whose intensity is lower than in the example illustrated in FIGS. 10A to 10C onto the amplifier 37.

Figure 12A:
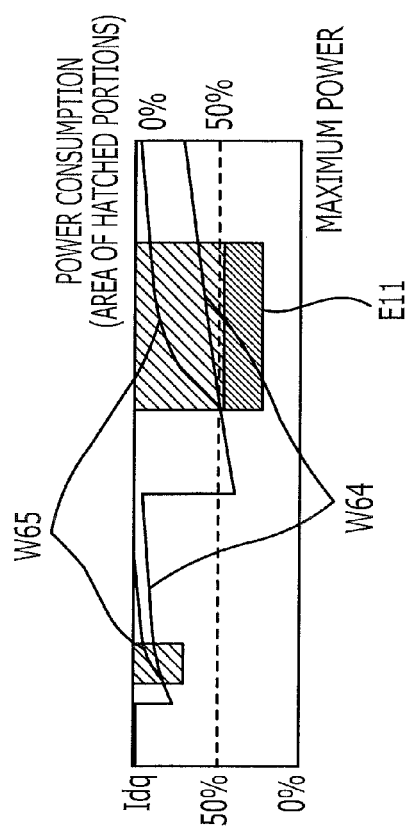
FIGS. 12A and 12B are diagrams illustrating recovery from current collapse realized by the heat of an amplifier itself.
Figure 12B:
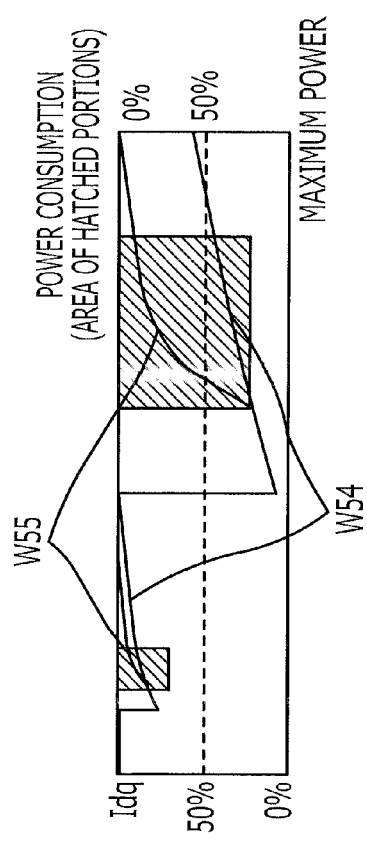

FIGS. 12A and 12B are diagrams illustrating recovery from current collapse realized by the heat of the amplifier 37 itself. In FIG. 12A, FIG. 10C is illustrated. In FIG. 12B, FIG. 11C is illustrated. In FIGS. 12A and 12B, waveforms that are the same as those illustrated in FIGS. 10A to 10C and 11A to 11C are given the same reference numerals as those used in FIGS. 10A to 10C and 11A to 11C, and description thereof is omitted.

When the envelope gradually inclines downward, the light radiation driving circuit 35 outputs, to the light radiation unit 36, driving current whose absolute value is smaller than when the envelope sharply inclines downward. That is, when the envelope gradually inclines downward, the amplifier 37 is irradiated with light whose intensity is lower than when the envelope sharply inclines downward.

The intensity in FIG. 12B is lower than that in FIG. 12A. However, for the portion in FIG. 12B where a decrease in the envelope is small, power is consumed in the amplifier 37 and recovery from the current collapse may be realized by light and heat. A hatched portion E11 illustrated in FIG. 12B indicates a degree of recovery expected to be realized by the heat of the amplifier 37 itself.

That is, when the envelope gradually inclines downward (when a negative peak of the slope of the envelope is small), the amplifier 37 may recover from current collapse with light of low intensity. That is, the amplification device 11c may reduce the power consumption in the light radiation unit 36.

Figure 13A:
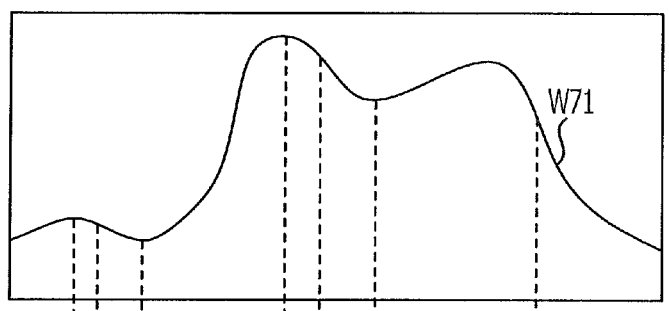
FIGS. 13A to 13C are diagrams illustrating behavior when light is radiated at peaks of an envelope.
Figure 13B:
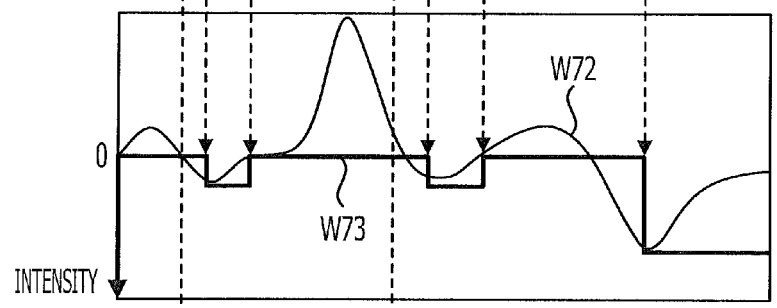
Figure 13C:
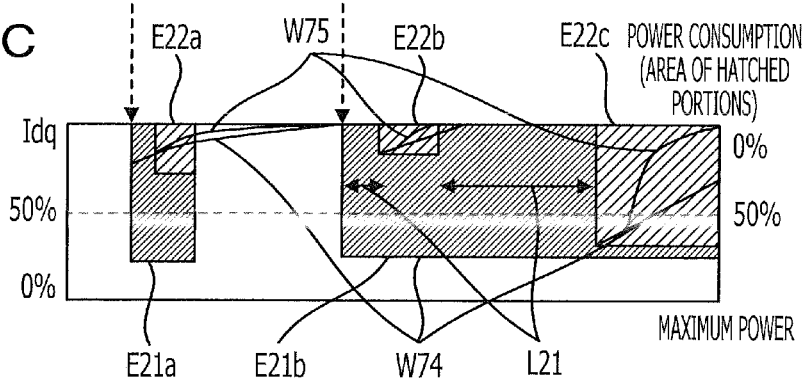

FIGS. 13A to 13C are diagrams illustrating an operation at a time when light is radiated at peaks of an envelope. Waveforms W71 to W75 illustrated in FIGS. 13A to 13C are similar to the waveforms W51 to W55 illustrated in FIGS. 10A to 10C. Differences between the waveforms W71 to W75 and the waveforms W51 to W55 will be described hereinafter.

Hatched portions E21a and E21b illustrated in FIG. 13C indicate power consumption at a time when radiation of light of a certain intensity is begun at peaks of the envelope and the radiation of light is stopped at a certain value of the envelope. Hatched portions E22a to E22c illustrated in FIG. 13C indicate power consumption at a time when light radiation is controlled in accordance with the slope of the envelope.

When radiation of light is controlled based on the peaks of the envelope, light of a certain intensity is radiated even when the envelope gradually inclines downward and recovery from current collapse is therefore expected to be realized by the heat of the amplifier 37 itself. Therefore, when the radiation of light is controlled based on the peaks of the envelope, power may be wastefully consumed. For example, although current collapse in the amplifier 37 may be appropriately addressed by the power consumption indicated by the hatched portion E22b, the current collapse is actually addressed by the power consumption indicated by the hatched portion E21b.

In addition, when the radiation of light is controlled based on the peaks of the envelope, light is uselessly radiated in some periods. For example, as illustrated by a period L21, there are some periods of undesirable light radiation.

Thus, in comparison with a case in which the radiation of light is controlled based on the peaks of the envelope, the amplification device 11c may reduce power consumption. In addition, since the amplification device 11c radiates light with an intensity corresponding to negative peaks of the slope of the envelope and radiates light in periods corresponding to the slope of the envelope, current collapse may be appropriately addressed without distorting a radio signal to be amplified.

Examples of the slope extraction circuit 33, the minimum value detection circuit 41, the zero detection circuit 42, the minimum value holding circuit 43, and the light radiation driving circuit 35 will be described hereinafter.

Figure 14:
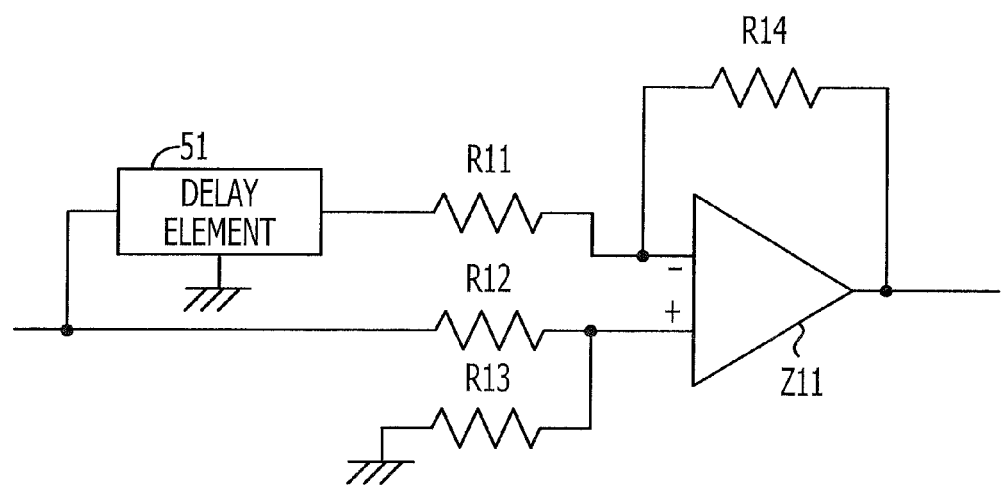
FIG. 14 is a diagram illustrating an example of the slope extraction circuit.

FIG. 14 is a diagram illustrating an example of the slope extraction circuit 33. As illustrated in FIG. 14, the slope extraction circuit 33 has a delay element 51, resistors R11 to R14, and a differential amplifier Z11. The delay element 51 and the resistor R12 are input with an envelope output from the envelope extraction circuit 31.

The slope extraction circuit 33 performs, for example, arithmetic processing in which a previous value of the amplitude of an envelope is subtracted from a current value of the amplitude of the envelope at intervals of multiples of the chip rate period (for example, 1.2288 MHz in cdmaOne and 3.84 MHz in Wideband Code-Division Multiple Access (WCDMA)) of a baseband signal. The delay element 51 delays, for example, the input envelope at intervals of multiples of the chip rate period, and outputs the envelopes to the resistor R11.

Thus, the slope extraction circuit 33 may, for example, obtain the waveform W22 indicating the slope of an envelope having the waveform W11 illustrated in FIG. 5. Instead of the example of the circuit illustrated in FIG. 14, the slope extraction circuit 33 may be formed by a differentiating circuit having a differential amplifier.

Figure 15:
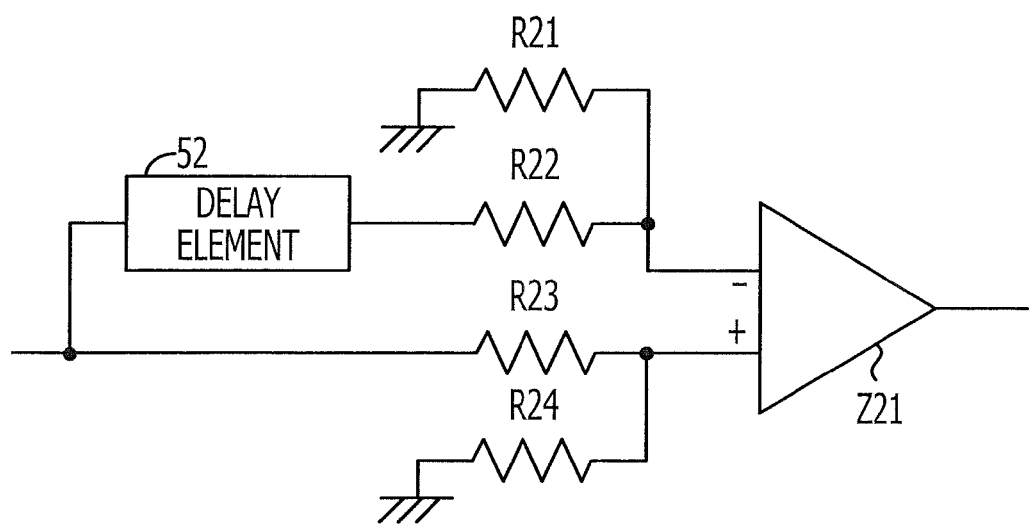
FIG. 15 is a diagram illustrating an example of the minimum value detection circuit.

FIG. 15 is a diagram illustrating an example of the minimum value detection circuit 41. As illustrated in FIG. 15, the minimum value detection circuit 41 has a delay element 52, resistors R21 to R24, and a differential amplifier Z21. The delay element 52 and the resistor R23 is input with a signal output from the slope extraction circuit 33.

The minimum value detection circuit 41 detects a minimum value of a portion of an input signal that is downwardly convex. The minimum value detection circuit 41 detects the minimum value of a portion that is downwardly convex by performing arithmetic processing in which a current value is compared with a previous value. The delay element 52 delays, for example, an input signal at intervals of integer multiples of a comparison period of the slope extraction circuit 33, and outputs the signals to the resistor R22. Thus, the minimum value detection circuit 41 may, for example, detect the minimum values Min11 and Min12 of the waveform W22 illustrated in FIG. 6.

Figure 16:
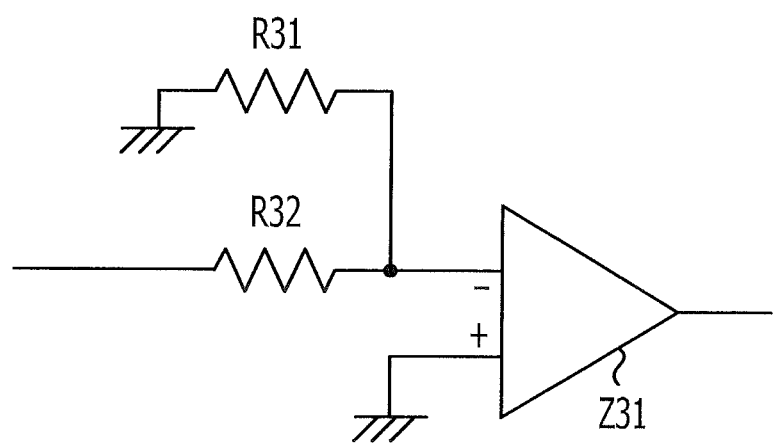
FIG. 16 is a diagram illustrating an example of the zero detection circuit.

FIG. 16 is a diagram illustrating an example of the zero detection circuit 42. As illustrated in FIG. 16, the zero detection circuit 42 has resistors R31 and R32 and a differential amplifier Z31. The resistor R32 is input with a signal output from the slope extraction circuit 33. The zero detection circuit 42 detects the timing at which the slope of an envelope output from the slope extraction circuit 33 changes from negative to positive. Thus, the zero detection circuit 42 may, for example, detect the zeros Zr11 and Zr12 of the waveform W32 illustrated in FIG. 7.

Figure 17:
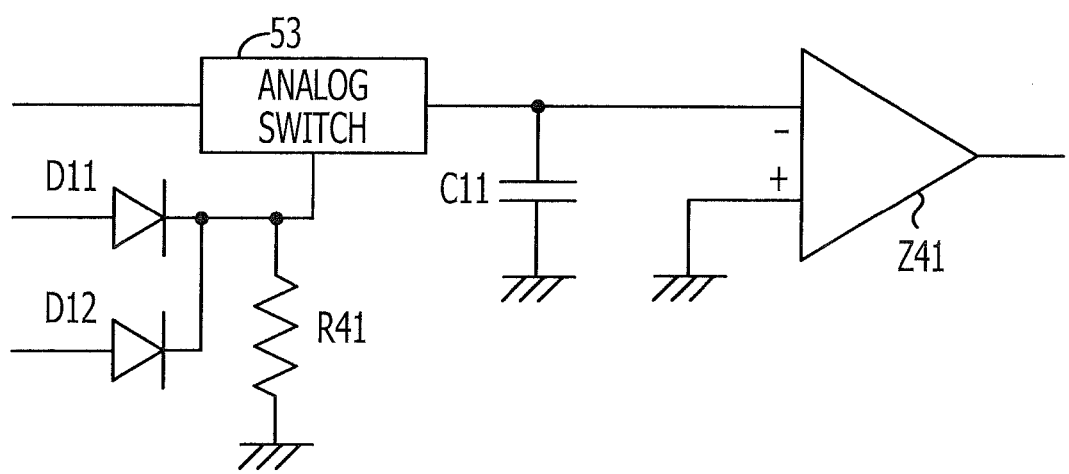
FIG. 17 is a diagram illustrating an example of the minimum value holding circuit.

FIG. 17 is a diagram illustrating an example of the minimum value holding circuit 43. As illustrated in FIG. 17, the minimum value holding circuit 43 has diodes D11 and D12, a resistor R41, an analog switch 53, a capacitor C11, and a differential amplifier Z41. The analog switch 53 is input with the slope of an envelope output from the slope extraction circuit 33. The diode D11 is input with a signal output from the minimum value detection circuit 41. The diode D12 is input with a signal output from the zero detection circuit 42.

The analog switch 53 in principle outputs the slope of the envelope output from the slope extraction circuit 33. When a signal has been input to the diode D11 from the minimum value detection circuit 41, the analog switch 53 holds and outputs the slope (a minimum value of the slope) of the envelope that is being input at that time. In addition, when a signal has been input to the diode D12 from the zero detection circuit 42, the analog switch 53 outputs the slope of the envelope that is being input. Thus, the minimum value holding circuit 43 outputs, for example, a signal having the waveform W43 illustrated in FIG. 8.

Figure 18:
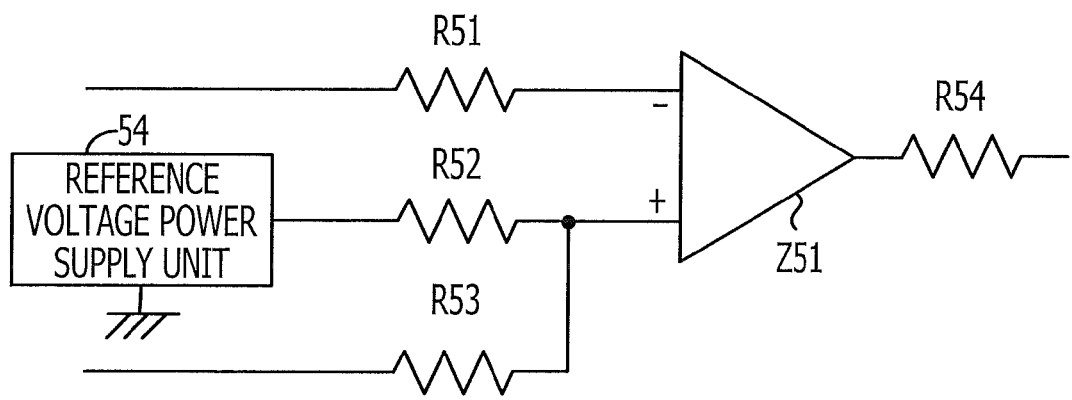
FIG. 18 is a diagram illustrating an example of the light radiation driving circuit.

FIG. 18 is a diagram illustrating an example of the light radiation driving circuit 35. As illustrated in FIG. 18, the light radiation driving circuit 35 has a reference voltage power supply unit 54, resistors R51 to R54, and a differential amplifier Z51. The resistor R51 is input with a signal output from the minimum value holding circuit 43. The resistor R53 is input with a signal output from the zero detection circuit 42.

Thus, the light radiation driving circuit 35 outputs, for example, a signal having the waveform W47 illustrated in FIG. 9.

Figure 19:
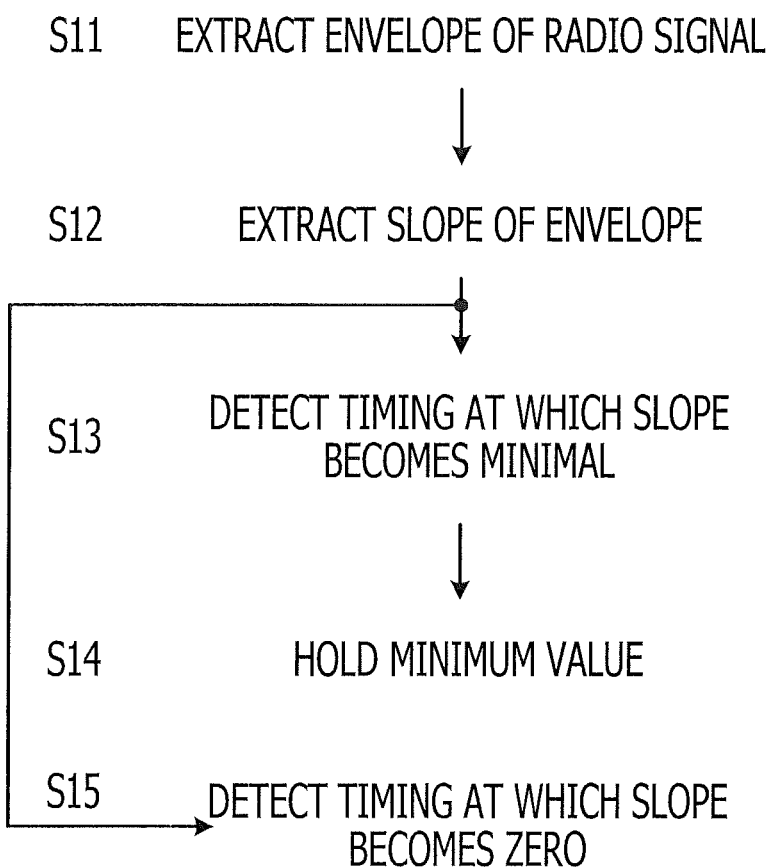
FIG. 19 is a flowchart illustrating the operation of the amplification device according to the second embodiment.

FIG. 19 is a flowchart illustrating the operation of the amplification device 11c. Process S11 is where the envelope extraction circuit 31 extracts an envelope of a radio signal to be amplified by the amplifier 37. The envelope of the radio signal is output to the variable power supply circuit 32, which in turn outputs power corresponding to the envelope to the amplifier 37.

Process S12 is where the slope extraction circuit 33 extracts the slope of the envelope extracted by the envelope extraction circuit 31.

Process S13 is where the minimum value detection circuit 41 detects the timing at which the slope of the envelope becomes minimal.

Process S14 is where the minimum value holding circuit 43 holds a minimum value of the slope of the envelope.

Process S15 is where the zero detection circuit 42 detects the timing at which the slope of the envelope becomes zero.

The light radiation driving circuit 35 outputs driving current based on both the minimum value of the slope of the envelope output from the minimum value holding circuit 43 and results of detection of zero slope output from the zero detection circuit 42. The driving current is output to the light radiation unit 36, which in turn radiates light corresponding to the driving current onto the amplifier 37.

As described above, the amplification device 11c controls the intensity of light that may be radiated onto the amplifier 37 and the period of radiation in accordance with the slope of the envelope. Thus, the amplification device 11c may appropriately improve current collapse while suppressing the power consumption due to the radiation of light.

When recovery from current collapse is expected to be realized by the heat of the amplifier 37 itself (that is, when the envelope gradually inclines downward), the amplification device 11c reduces the intensity of the light radiated. Therefore, power consumption may be reduced. In addition, the amplification device 11c may reduce the period of time over which recovery from current collapse is realized while reducing power consumption.

In a high-frequency amplification device, high distortion performance is desired. In general, when the gate bias is reduced and a lot of drain current is caused to flow in an amplification device, distortion performance improves. If the gate bias is used to control the illumination of an LED in this case, the gate bias is increased in order to radiate light of high intensity. However, when the gate bias is increased, the distortion performance of the amplification device deteriorates as may be ascertained from above. On the other hand, with the amplification device 11c, a gate circuit of the amplifier 37 and the light radiation unit 36 are separated from each other. For example, the amplification device 11c does not use the gate bias voltage of the amplifier 37 to control the illumination of the light radiation unit 36. Therefore, the amplification device 11c may radiate appropriate light onto the amplifier 37 without reducing the distortion performance. In addition, since the gate bias voltage and the control of the illumination of the LED are independent from each other in the amplification device 11c, the gate bias voltage may be set such that distortion performance that is high enough to satisfy spurious standards regarding intensity such as standards based on Japan's Radio Act is obtained.

Third Embodiment

Next, a third embodiment will be described in detail with reference to the drawings. In the third embodiment, the temperature of an amplification device is detected, and light that may be radiated onto an amplifier is controlled based on the detected temperature.

Figure 20:
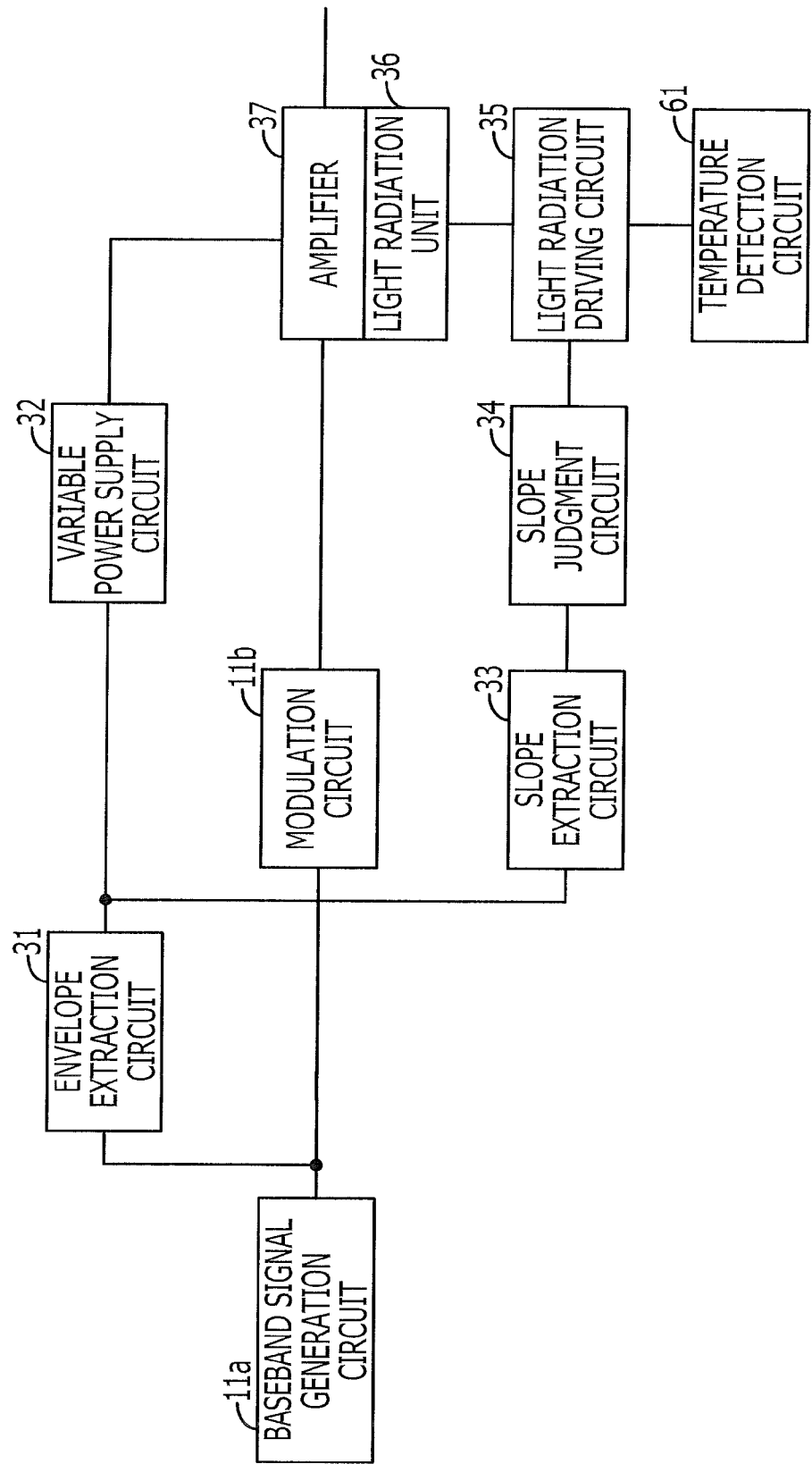
FIG. 20 is a diagram illustrating an example of a circuit block of an amplification device according to a third embodiment.

FIG. 20 is a diagram illustrating an example of a circuit block of an amplification device according to the third embodiment. In FIG. 20, components that are the same as those illustrated in FIG. 3 are given the same reference numerals as those used in FIG. 3, and description thereof is omitted.

As illustrated in FIG. 20, the amplification device 11c has a temperature detection circuit 61. The temperature detection circuit 61 detects the temperature of the amplification device 11c. The temperature detection circuit 61 is, for example, a thermistor.

The light radiation driving circuit 35 has the same function as that described in the second embodiment, but, in the third embodiment, also controls the light that may be emitted from the light radiation unit 36 based on the temperature detected by the temperature detection circuit 61. For example, when the temperature detected by the temperature detection circuit 61 is greater than a certain temperature, the light radiation driving circuit 35 controls the light in such a way as not to be emitted from the light radiation unit 36. That is, when the temperature detected by the temperature detection circuit 61 is less than or equal to the certain temperature, the light radiation driving circuit 35 controls the light in accordance with the slope of an envelope.

The certain temperature is, for example, a temperature at which it is hard to supply thermal energy to be used to release trapped electrons in the amplifier 37. For example, the certain temperature may be 0 degrees Celsius.

Thus, the amplification device 11c controls the light in accordance with the slope of an envelope in a temperature condition where recovery from current collapse may be slow. Therefore, the amplification device 11c may reduce power consumption.

Fourth Embodiment

Next, a fourth embodiment will be described in detail with reference to the drawings. In the fourth embodiment, gain of an amplifier is detected, and light that may be radiated onto the amplifier is controlled based on the detected gain.

Figure 21:
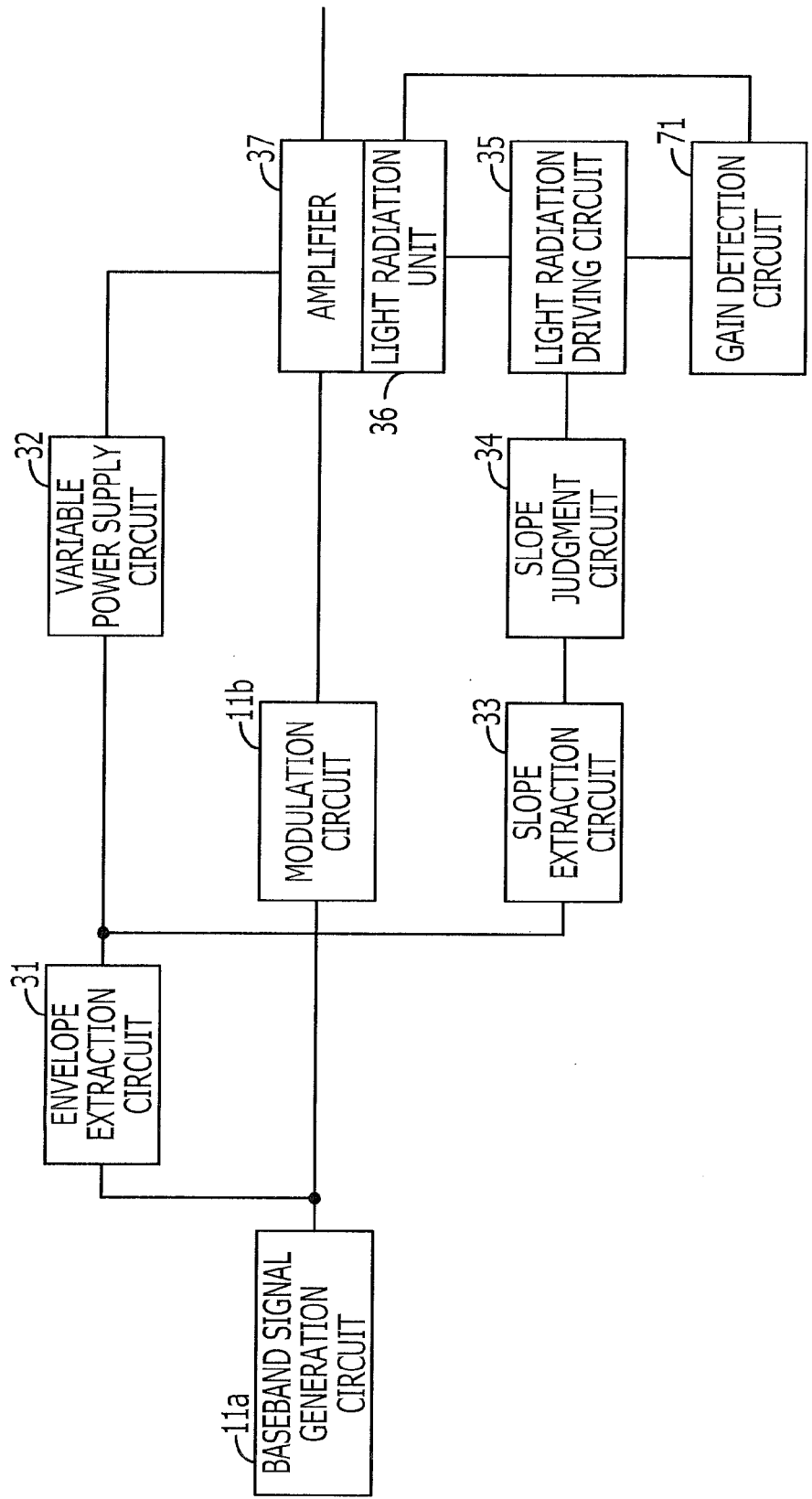
FIG. 21 is a diagram illustrating an example of a circuit block of an amplification device according to a fourth embodiment.

FIG. 21 is a diagram illustrating an example of a circuit block of an amplifier according to the fourth embodiment. In FIG. 21, components that are the same as those illustrated in FIG. 3 are given the same reference numerals as those used in FIG. 3, and description thereof is omitted.

As illustrated in FIG. 21, the amplification device 11c has a gain detection circuit 71. The gain detection circuit 71 detects gain of the amplifier 37. The gain detection circuit 71 detects (estimates) the gain of the amplifier 37 by obtaining a difference between output power of the amplifier 37 and power supplied to the amplifier 37.

The light radiation driving circuit 35 has the same function as that described in the second embodiment, but, in the fourth embodiment, also controls the light that may be emitted from the light radiation unit 36 based on the gain detected by the gain detection circuit 71. For example, when the gain detected by the gain detection circuit 71 has decreased by a certain value, the light radiation driving circuit 35 controls the light in accordance with the slope of an envelope. When the gain detected by the gain detection circuit 71 does not decrease by the certain value, the light radiation driving circuit 35 controls the light so that the light is not emitted from the light radiation unit 36. That is, when a decrease in the gain of the amplifier 37 may be assumed to be caused by current collapse, the light radiation driving circuit 35 controls the light in accordance with the slope of an envelope.

Thus, when there has been a decrease in the gain caused by current collapse, the amplification device 11c controls the light in accordance with the slope of an envelope. Therefore, the amplification device 11c may reduce power consumption.

It may be noted that the amplification device 11c might have a pre-distortion circuit that compensates for the distortion of a signal caused by the amplifier 37. In this case, the light radiation driving circuit 35 may control the light in accordance with the slope of an envelope using gain detected by a gain detection circuit included in the pre-distortion circuit. In such a case, the gain detection circuit 71 is not included in the amplification device 11c, and accordingly the size of the circuit may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplification device that amplifies a signal, the amplification device comprising:
   an amplification unit that amplifies the signal using supplied power;
   a variable power supply unit that changes the power supplied to the amplification unit in accordance with an envelope of the signal;
   a radiation unit that radiates light onto the amplification unit; and
   a control unit that controls the light to be emitted from the radiation unit in accordance with slope of the envelope of the signal.

2. The amplification device according to claim 1,
   wherein the control unit controls a period of time in which the light to be emitted from the radiation unit is emitted and an intensity of the light.

3. The amplification device according to claim 2,
   wherein, when the slope of the envelope of the signal has reached a negative peak, the control unit performs control such that the radiation unit emits the light, and when the slope of the envelope of the signal has changed from negative to positive, the control unit controls such that the radiation unit stops emitting the light.

4. The amplification device according to claim 2,
   wherein the control unit controls the intensity of the light to be emitted from the radiation unit based on the magnitude of the negative peak of the slope of the envelope of the signal.

5. The amplification device according to claim 1, further comprising:
   a temperature detection unit that detects temperature,
   wherein the control unit controls the light to be emitted from the radiation unit based on the temperature detected by the temperature detection unit.

6. The amplification device according to claim 5,
wherein, when the temperature detected by the temperature detection unit is higher than a certain temperature, the control unit controls such that the radiation unit does not emit the light.

7. The amplification device according to claim 1, further comprising:
a gain detection unit that detects a gain of the amplification unit,
wherein the control unit controls the light to be emitted from the radiation unit based on the gain detected by the gain detection unit.

8. The amplification device according to claim 7,
wherein, when the gain detected by the gain detection unit has decreased by a certain value, the control unit controls the light in accordance with the slope of the envelope.

* * * * *